United States Patent [19]
Hartung

[11] 3,958,185
[45] May 18, 1976

[54] LOW NOISE AMPLIFIER
[75] Inventor: Joseph Charles Hartung, Round Rock, Tex.
[73] Assignee: International Business Machines Corporation, Armonk, N.Y.
[22] Filed: June 26, 1975
[21] Appl. No.: 590,660

[52] U.S. Cl. ................................ 330/149; 330/25; 330/38 M; 330/85
[51] Int. Cl.² ........................................ H03F 1/26
[58] Field of Search ................ 330/25, 9, 38 M, 62, 330/85, 97, 149

[56] References Cited
UNITED STATES PATENTS
3,740,659   6/1973   Matsushima et al. ............. 330/85 X

*Primary Examiner*—James B. Mullins
*Attorney, Agent, or Firm*—Douglas H. Lefeve

[57] ABSTRACT

An amplifier particularly suited for use as a sense amplifier for the detection of magnetic bubble domains in a magnetic bubble chip. A feedback loop is used to reduce D.C. offset of the input and output signals. Noise unavoidably introduced into the feedback loop is cancelled upon input of the feedback signal into the amplifier. The noise cancellation is effected by the introduction into the amplifier input of another noise signal of equal magnitude and opposite polarity provided by another noise pickup loop separate from the feedback loop.

9 Claims, 2 Drawing Figures

LOW NOISE AMPLIFIER

BACKGROUND OF THE INVENTION

1. Field of the Invention

This invention relates to amplifiers and more particularly to amplifiers operable in relatively high noise environments wherein the noise received by the amplifier must be substantially reduced to provide a suitable signal to noise ratio.

2. Description of the Prior Art

The sensing of magnetic bubble domains at a particular point in a magnetic bubble chip has been accomplished in the prior art by placement of a magnetoresistive sensor at the point in the chip at which sensing is to occur. A current source is connected in parallel with the magnetoresistive sensor to provide a fixed current flow through the sensor. The magnetic flux attributable to the presence of a magnetic bubble closely adjacent the magnetoresistive sensor provides a change in the resistance of the sensor such that a different voltage is present across the sensor terminals than is present in the absence of a magnetic bubble domain.

The resistance variation depending on the presence or absence of a magnetic bubble domain closely adjacent a magnetoresistive sensor is small. For example, a resistance variation of 1 percent is not unusual. Further, the fixed current that is passed through the sensor is limited to a relatively low value both to avoid electromigration and to minimize the magnetic field produced by the current flow itself, which would, otherwise, override the field provided by the magnetic bubble domain unless held to a negligible intensity by limiting the current flow through the magnetoresistive sensor.

The voltage variation between the presence and absence of magnetic bubble domains in close proximity to the magnetoresistive sensor is the product of the current flowing through the sensor and the resistance variation of the sensor. As a result of the limited resistance variation and the limited current flowing through the sensor, as described above, the difference in voltage across the sensor depending on the presence or absence of magnetic bubble domains closely adjacent the sensor is rather small.

The small signal output from the magnetoresistive sensor must, therefore, be amplified to provide signal levels compatible with conventional logic circuitry. In magnetic bubble memory systems a major problem in amplifying the small output signal from the magnetoresistive sensors is that the signal leads are subjected to the noise introduced by the time varying, rotating magnetic field used to bias the magnetic bubble chip. The direction of this magnetic field is parallel to the magnetic bubble chip and to the substrate; therefore, if conductors are looped from the top surface of the chip down to the top surface of the substrate, the loops form an area that is perpendicular to the time varying magnetic field which allows maximum pickup of noise on these signal output leads. One solution to this problem has been to mount a sense amplifier closely adjacent the magnetoresistive sensors on the magnetic bubble chip to amplify the sensing signals to a relatively high level before the signals are brought out of the area of the time varying magnetic field. Two advantages of this approach are that 1) the signals are at a relatively high level when the noise component is added to them by virtue of the loops and 2) a relatively smaller amount of noise is introduced into the signal from the magnetoresistive sensors before amplification because the area of the loops of wires between the magnetic bubble chip and the sense amplifier chip that are perpendicular to the time varying magnetic field may be minimized.

It is desirable to reduce any D.C. offset at the input and at the output of the amplifier. This can be accomplished by use of relatively expensive amplifier circuitry or by use of relatively inexpensive amplifier circuitry with a feedback loop including another amplifier having an input connected to the output of the sense amplifier and an output connected to the input of the sense amplifier. A bypass capacitor is used at the input of the feedback amplifier to present a low impedance path to ground for the high frequency bubble domain sense signal so that only the D.C. offset component of the sense amplifier output signal is amplified by the feedback amplifier and introduced back into the input of the sense amplifier. In an integrated circuit implementation of the sense amplifier and feedback loop, the capacitor must be mounted off of the amplifier integrated circuit chip. In mounting the capacitors off of the amplifier chip, loops of wire subject to noise pickup must be installed between the surface of the amplifier chip and the substrate. The noise picked up by these loops is then introduced into the input of the feedback amplifier, is amplified, and is then introduced into an input of the sense amplifier whereupon the noise is then amplified by a factor equal to the gain of the sense amplifier. This, of course, may result in the presence of noise in the output signal that is of the same order of magnitude as the amplified sense signal.

It would, therefore, be desirable to amplify relatively small signals by utilization of an amplifier including a feedback loop, whereby noise introduced into the amplifier by the feedback loop is cancelled to inhibit amplification of this noise.

SUMMARY OF THE INVENTION

Accordingly, the amplifier system of this invention includes a feedback loop connecting an amplifier output back to an input of the amplifier for reduction of D.C. offset of the input and output signals. Noise unavoidably picked up by the feedback loop is introduced back into the amplifier input. The noise is cancelled, however, by another noise signal input to the amplifier having a magnitude equal to and a polarity opposite to that of the noise introduced into the amplifier input from the feedback loop.

In the preferred embodiment a differential amplifier is utilized as a sense amplifier to amplify relatively low level, high frequency signals. The inputs of another differential, inverting amplifier in a feedback loop are connected to the outputs of the sense amplifier. The amplified high frequency components of the output signals are bypassed to ground by capacitors connected between the inputs of the feedback amplifier and ground. However, because both the differential sense amplifier and the differential feedback amplifier are fabricated on an integrated circuit chip, the bypass capacitors, being of much greater capacitance than can be conveniently fabricated in the integrated amplifier circuitry, must be discrete components mounted off of the chip. The conductors connecting these capacitors to the inputs of the differential, feedback amplifier are highly susceptible to noise pickup. The noise picked up by these conductors, which are connected to the input of the differential, feedback amplifier is applied to the inputs of the sense amplifier through the feedback amplifier. To cancel the effect of this noise, the conductors along which the relatively low level, high frequency signals to be amplified are conveyed are oriented to pick up noise of opposite polarity to the noise picked up by the conductors leading to the capacitors. This noise is summed at the inputs of the sense amplifier along with the noise from the feedback amplifier introduced by the capacitor leads. The lead configurations are chosen according to the feedback amplifier gain such that with equal magnitudes of these noise signals of opposite polarity, the noise that would otherwise be amplified by the sense amplifier is cancelled at the inputs thereof.

The foregoing and other objects, features, and advantages of the inventors will be apparent from the following more particular description of preferred embodiments of the invention, as illustrated in the accompanying drawing.

DETAILED DESCRIPTION OF THE PREFERRED EMBODIMENTS

Figure 1:
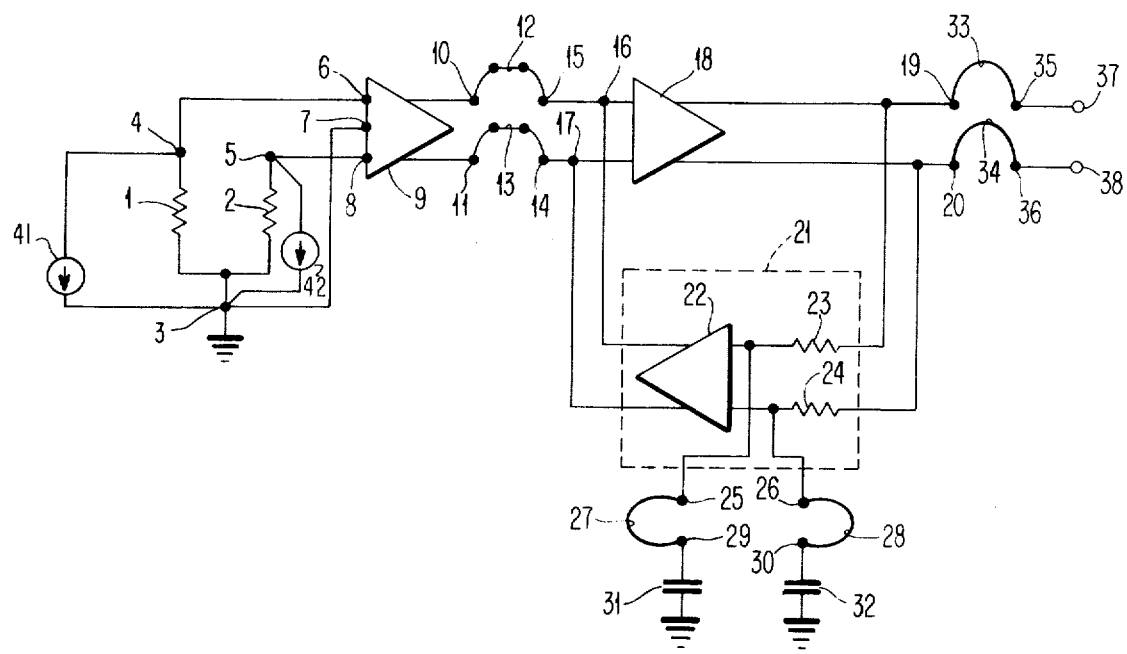
FIG. 1 is a schematic diagram of an amplification system embodying the low noise amplifier of this invention.

Referring now to FIG. 1 a system is shown for amplifying the relatively low level, high frequency signals derived from magnetoresistive sensors in sensing the presence or absence of magnetic bubble domains closely adjacent the sensors. In FIG. 1 magneto-resistive sensors 1 and 2 each have one terminal connected to ground at node 3. Another terminal of sensor 1 is connected to node 4 and another terminal of sensor 2 is connected to node 5. A current source 41 is connected between node 4 and ground to provide a fixed current flow through sensor 1 and another current source 42 is connected between node 5 and ground to provide a fixed current flow through sensor 2 equal to the current flow through sensor 1 provided by current source 41. The resistance values of sensors 1 and 2 are relatively closely matched such that the voltages across sensors 1 and 2 are substantially equal when substantially equal magnetic fields are present adjacent sensors 1 and 2.

The voltages present at nodes 4 and 5 are applied to input terminals 6 and 8 of differential amplifier 9 respectively. The ground potential present at node 3 is connected to terminal 7 of amplifier 9. The signal levels present at the input terminals 6 and 8 of amplifier 9 may be, for example, in the range of one millivolt. Amplifier 9 may have, for example, a gain of about 10, and with this relatively low gain it is relatively easy to assure a substantially low D.C. offset of the output signals at output terminals 10 and 11 of amplifier 9 and of the input signals at terminals 6 and 8 of amplifier 9.

The output signals at terminals 10 and 11 are conveyed to terminals 15 and 14, respectively, through conductive loops 12 and 13, respectively, to be described in more detail hereinafter. The signals at terminals 15 and 14 are connected to input terminals 16 and 17, respectively, of differential amplifier 18.

Differential amplifier 18 may have a relatively higher gain than amplifier 9 and may, therefore, be more adversely affected by D.C. offset of the output signals present at output terminals 19 and 20 and of the input signals present at terminals 16 and 17, respectively, of differential amplifier 18. To eliminate this D.C. offset a feedback circuit 21 is connected between the output terminals 19 and 20 of amplifier 18 and the input terminals 16 and 17, respectively, thereof. Feedback circuit 21 comprises an inverting, differential amplifier 22 having inputs connected to output terminals 19 and 20 of amplifier 18 through resistors 23 and 24, respectively, which have a relatively high resistance. Assuming that the output impedances of amplifier 18 are substantially low and the input impedances of amplifier 22 are substantially high, there is negligible attenuation of the output signals of amplifier 18 by connection to the inputs of amplifier 22 through resistors 23 and 24.

Capacitors 31 and 32 are connected between terminals 29 and 30, respectively, and ground. These capacitors provide a very low impedance path to ground for the amplified, high frequency signal components at the inputs of amplifier 22. Conductors connecting the inputs of amplifier 22 to terminals 25 and 26 are utilized along with conductive loops 27 and 28, to be discussed in more detail hereinafter, to convey these signals to capacitors 31 and 32, respectively. The relatively low impedance path to ground offered by capacitors 31 and 32 does not substantially decrease the magnitude of the output signals of amplifier 18 at terminals 19 and 20 because of the high series resistance offered by resistors 23 and 24. Thus, the D.C. offset component of the output signals present at terminals 19 and 20, without the high frequency component thereof, is passed through and inverted by amplifier 22 and returned to the input terminals 16 and 17 of amplifier 18. With the feedback circuit, the D.C. offset at the output terminals of amplifier 18 is substantially eliminated.

Figure 2:
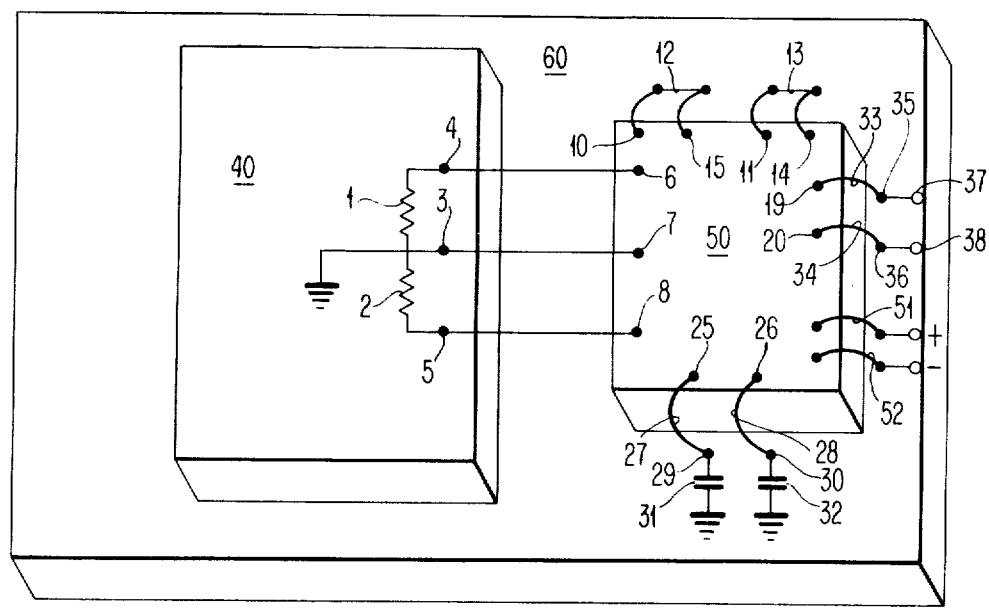
FIG. 2 is a pictorial diagram of the preferred embodiment of this invention as utilized for the sensing of magnetic bubble domains in a magnetic bubble chip.

Referring now to FIG. 2, a magnetic bubble chip 40 is shown mounted on a substrate 60. As shown in the schematic diagram of FIG. 1, one end of sensors 1 and 2 is connected to ground at node 3 on chip 40 while other ends of sensors 1 and 2 are connected to nodes 4 and 5, respectively, on chip 40. Integrated circuit amplifier chip 50 is mounted on substrate 60 closely adjacent to bubble chip 40. Included in integrated circuit chip 50 are amplifiers 9, 18, and 22 and resistors 23 and 24. Also included in chip 50 are the current sources 41 and 42.

Assume now that a time varying, rotating magnetic field is oriented in a plane parallel to the plane of the upper surfaces shown in FIG. 2 of chips 40 and 50 and substrate 60. Conductive loops 27 and 28 connecting capacitors 31 and 32, respectively, to the inputs of amplifier 22 lie in planes perpendicular to the plane of the time varying magnetic field. Thus, conductive loops 27 and 28 are highly susceptible to noise pickup from the time varying magnetic field. Conductive loops 33 and 34 connecting output terminals 19 and 20, respectively, of amplifier 18 to terminals 35 and 36, respectively, on substrate 60 that lead to terminals 37 and 38, respectively, at an edge of substrate 38 are also susceptible to this noise pickup from the time varying magnetic field. However, the amplified, high frequency output signal from amplifier 18 is of a high enough level to override the noise picked up by conductive loops 33 and 34. The problem caused by the noise pickup by loops 27 and 28 is that this noise is fed back into the inputs of amplifier 18 for amplification by amplifier 18 by a factor equal to the gain of amplifier 18. Of course conductive loops 51 and 52 connecting the power supply leads to amplifier chip 50 are also susceptible to noise pickup but this noise can be easily kept out of the signal path by common mode rejection with respect to differential amplifiers that is well known to those skilled in the art.

The magnetic flux density of the time varying magnetic field is expressed as the quantity, H. The time rate of change of the flux density of this magnetic field is expressed as the quantity $\dot{H}$. The voltage induced into the conductors is equal to the area bounded by the conductors that is perpendicular to the time varying magnetic field, multiplied by $\dot{H}$. That is, for the loops shown in FIG. 2 that are perpendicular to the time varying magnetic field:

$$V_{loop} = A_{loop}\dot{H} \qquad (1)$$

With respect to the relatively high frequency noise, conductive loops 27 and 28 can be considered to be connected together and connected to ground at terminals 29 and 30 since capacitors 31 and 32 offer a very low impedance path to ground from terminals 29 and 30. Thus, the voltages induced in loops 27 and 28 add together and can be considered as a single loop 27–28. On the opposite side of amplifier chip 50 the output signals at terminals 10 and 11 from amplifier 9 are fed through conductive loops 12 and 13, respectively, to terminals 15 and 14, respectively, and then into the input terminals 16 and 17, respectively, of amplifier 18. Since conductive loops 12 and 13 are at opposite edges of chip 50 from loops 27 and 28, the voltages induced by the noise into loops 12 and 13 are 180° out of phase with the noise introduced into loops 27 and 28. Thus, noise is summed at input terminals 16 and 17 of amplifier 18 that is derived both from loop 27–28 and also from loops 12 and 13. The voltage induced in the single, full loop 27–28 is given as:

$$V_{loop\ 27\text{-}28} = A_{loop\ 27\text{-}28}\dot{H} \qquad (2)$$

The voltages induced in loops 12 and 13, of opposite polarity to that of $V_{loop\ 27\text{-}28}$, are given as:

$$V_{loop\ 12} = A_{loop\ 12}\dot{H};\text{ and} \qquad (3)$$

$$V_{loop\ 13} = A_{loop\ 13}\dot{H} \qquad (4)$$

The noise attributable to loop 27 and 28 that is amplified by inverting differential amplifier 22 and applied to input terminals 16 and 17 of amplifier 18 is a function of the gain of amplifier 22 expressed as $K_{22}$. Thus, the net noise summed at terminals 16 and 17, denoted $V_{noise}$, is expressed as:

$$V_{noise} = V_{loop\ 12} + V_{loop\ 13} - V_{loop\ 27\text{-}28}(K_{22}) \qquad (5)$$

To minimize noise amplification by amplifier 18:

$$V_{noise} = 0 = V_{loop\ 12} + V_{loop\ 13} - V_{loop\ 27\text{-}28}K_{22} \qquad (6)$$

It is now clear, therefore, that by the provision of either one of loops 12 and 13 or both of loops 12 and 13, by the adjustment of the areas thereof perpendicular to the time varying magnetic field and by the adjustment of amplifier 22 gain $K_{22}$, the noise at input terminals 16 and 17 of amplifier 18 can easily be reduced to zero. It is further understood by those skilled in the art that if amplifiers 18 and 22 were single-ended amplifiers, rather than differential amplifiers, this invention could also be employed for noise cancellation, again, by use of a noise pick-up loop into the input of the single-ended sense amplifier oriented 180° from the orientation of the loop connecting the input of the feedback amplifier to the bypass capacitor. It is understood that this 180° orientation of the loops provides the simplest noise cancellation geometry and that considerable signal processing would be necessary if the cancellation loop (12 or 13) were placed at an orientation other than 180° or 0° from the other loop (27 or 28) from which noise is unavoidably introduced into the system. While the preferred embodiments described above have shown the placement of the cancellation loops at 180°, it is obvious to those having skill in the art that the loops could be oriented at 0° with the polarity of the feedback amplifier outputs reversed.

It is also understood by those skilled in the art that the noise cancellation technique described above could also be applied with respect to amplifier 9 as well as with respect to amplifier 18, as shown and described. If an appreciable D.C. offset is introduced by amplifier 9, a feedback circuit similar to circuit 21 could be used with respect to amplifier 9 to cancel the D.C. offset in which case noise could be introduced by conductive loops connected to bypass capacitors. In this case cancellation loops could then be introduced between terminals 4 and 6 or between terminals 5 and 8 or between both of the sets of terminals with the areas formed by these cancellation loops, the areas formed by the loops leading to the capacitors, and the gain of the feedback amplifier associated with amplifier 9 being correctly chosen to provide substantially full cancellation of the noise into terminals 6 and 8 of amplifier 9. It is, of course, also understood by those skilled in the art that the number of amplification stages used is a designer's choice and that this invention could be applied to a single amplifier stage in a system having only one amplifier stage or to any number of the amplifier stages in a system having a plurality of amplifier stages.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An amplification system comprising:
a first amplifier having an input and an output;
feedback means connecting said output to said input for reduction of D.C. offset of an output signal of said first amplifier, said feedback means introducing external noise into said input; and
noise cancellation means connected to said input for cancelling noise introduced by said feedback means by introduction into said input of additional noise of equal magnitude and opposite polarity.

2. The amplification system of claim 1 further comprising an input signal means for providing a signal to said input of said first amplifier for amplification, said noise cancellation means connecting said input signal means to said input of said first amplifier.

3. The amplification system of claim 2 wherein said feedback means includes a second amplifier having an output connected to said input of said first amplifier and an input connected to said output of said first amplifier.

4. The amplification system of claim 3 wherein said external noise is introduced into said input by a conductive means connected to said feedback means and said noise cancellation means further comprises another conductive means oriented 180° with respect to said conductive means connected to said feedback means.

5. The amplification system of claim 4 wherein said first amplifier and said second amplifier are differential amplifiers and said second amplifier is connected as an inverting amplifier.

6. The amplification system of claim 5 wherein said input signal means comprises a magnetoresistive sensor connected in parallel with a current source.

7. The amplification system of claim 3 wherein said external noise is introduced into said input by a conductive means connected to said feedback means and said noise cancellation means further comprises another conductive means oriented 0° with respect to said conductive means connected to said feedback means.

8. The amplification system of claim 7 wherein said first amplifier and said second amplifier are differential amplifiers and said second amplifier is connected as a noninverting amplifier, and said first amplifier is connected as an inverting amplifier.

9. The amplification system of claim 8 wherein said input signal means comprises a magnetoresistive sensor connected in parallel with a current source.

* * * * *